(12) United States Patent
Södö et al.

(10) Patent No.: US 12,396,127 B2
(45) Date of Patent: Aug. 19, 2025

(54) HEAT PIPE COOLING DEVICE AND METHOD WITH FAN CONTROLLED BASED ON AIR TEMPERATURE

(71) Applicant: Vacon Oy, Vaasa (FI)

(72) Inventors: Nicklas Jan Anders Södö, Vaasa (FI); Tommi Keski-Kujala, Vaasa (FI); Tuomas Yli-Rahnasto, Vaasa (FI)

(73) Assignee: VACON OY, Vaasa (FI)

( * ) Notice: Subject to any disclaimer, the term of this patent is extended or adjusted under 35 U.S.C. 154(b) by 392 days.

(21) Appl. No.: 17/735,241

(22) Filed: May 3, 2022

(65) Prior Publication Data
US 2022/0361364 A1    Nov. 10, 2022

(30) Foreign Application Priority Data

May 5, 2021   (DE) ...................... 10 2021 111 632.5

(51) Int. Cl.
*H05K 7/20* (2006.01)
*F28D 15/00* (2006.01)

(52) U.S. Cl.
CPC ..... *H05K 7/20209* (2013.01); *H05K 7/20136* (2013.01); *H05K 7/20336* (2013.01); *H05K 7/2039* (2013.01); *F28D 15/00* (2013.01)

(58) Field of Classification Search
None
See application file for complete search history.

(56) References Cited

U.S. PATENT DOCUMENTS

| | | | | |
|---|---|---|---|---|
| 6,041,850 | A | * | 3/2000 | Esser ................. H05K 7/20945 174/15.2 |
| 2002/0121359 | A1 | * | 9/2002 | Heikkila ............... H01L 23/427 165/104.11 |
| 2011/0289951 | A1 | * | 12/2011 | Furlong ................ F24F 5/0035 29/890.035 |

(Continued)

FOREIGN PATENT DOCUMENTS

| | | |
|---|---|---|
| CN | 1924824 A | 3/2007 |
| CN | 108132686 A | 6/2018 |

(Continued)

OTHER PUBLICATIONS

Andreas Griesinger, "Warmemanagement in der Elektronik," and its English machine translation, Berlin, Germany, Springer Vieweg, 2019, ISBN 978-3-662-58681-5, https://doi.org/10.1007/978-3-662-58682-2.

*Primary Examiner* — Bernard G Lindsay
(74) *Attorney, Agent, or Firm* — McCormick, Paulding & Huber PLLC

(57) ABSTRACT

A method for cooling a device such as an electric motor drive or a general power converter, said device comprising a heatsink, electronic components connected to the heatsink, a heat pipe connected to the heatsink, an inlet air temperature measuring device and a cooling fan. According to the method, the drive establishes whether the inlet air temperature is below a first temperature threshold value and operates the cooling fan at a low inlet air temperature speed regime if the inlet air temperature is below the first temperature threshold value. The invention is also directed at a device such as an electric motor drive or a general power converter for performing the cooling method.

22 Claims, 4 Drawing Sheets

(56) References Cited

U.S. PATENT DOCUMENTS

| | | | |
|---|---|---|---|
| 2012/0218707 A1* | 8/2012 | Chan | H05K 7/20518 |
| | | | 361/679.48 |
| 2013/0000871 A1 | 1/2013 | Olson et al. | |
| 2014/0326442 A1* | 11/2014 | Kurpiewski | G06F 1/206 |
| | | | 165/287 |
| 2017/0331127 A1* | 11/2017 | Moghimi | H01M 8/04753 |
| 2018/0347575 A1* | 12/2018 | Altemose | F04D 27/004 |
| 2020/0124951 A1* | 4/2020 | Chang | G03B 21/16 |
| 2020/0281092 A1 | 9/2020 | Tawada et al. | |

FOREIGN PATENT DOCUMENTS

| | | |
|---|---|---|
| JP | 2013-138041 A | 7/2013 |
| WO | 2019058466 A1 | 3/2019 |

* cited by examiner

HEAT PIPE COOLING DEVICE AND METHOD WITH FAN CONTROLLED BASED ON AIR TEMPERATURE

CROSS-REFERENCE TO RELATED APPLICATION

This application claims foreign priority benefits under U.S.C. § 119 from German Patent Application No. 10 2021 111 632.5 filed May 5, 2021, the content of which is hereby incorporated by reference in its entirety.

TECHNICAL FIELD

The present invention relates to a method for cooling a device such as an electric motor drive or a general power converter, said device comprising a heatsink, electronic components connected to the heatsink, a heat pipe connected or integrated to the heatsink, an inlet air temperature measuring device and a cooling fan. According to the method, the drive establishes whether the inlet air temperature is below a first temperature threshold value and operates the cooling fan at a low inlet air temperature speed regime if the inlet air temperature is below the first temperature threshold value. The invention is also directed at a device such as an electric motor drive or a general power converter for performing the cooling method.

BACKGROUND

Forced air cooling is common for preventing electronic equipment from overheating. Typically, heat generating components of electronic equipment such as electric motor drives or general power converters are connected to a heatsink and a fan is used to force air past the heatsink. In order to render such cooling systems more efficient, a heatsink may be equipped with a heat pipe. As the thermal conductivity of a heat pipe is considerably better that of typical heatsink material, such as aluminium, heat may be dissipated into the heatsink and to surrounding air more efficiently.

A heat pipe is a sealed container, from which all air has been removed and in which a vacuum or partial vacuum has been created. The heat pipe is partially filled with a working fluid, which may be water. Water may be used because of its lows cost and suitable heat transfer capability. However, a drawback of water is that it freezes when ambient temperatures drop beneath zero degrees centigrade. Although heat pipe freezing is not a major problem as such, since heat energy dissipated from a heat source will usually unfreeze the heat pipe, problems may arise when forced cooling fans are combined with a heat pipe in low ambient temperatures. Such cooling fans are usually controlled such that their fan speed is determined from experiments and represents a compromise value. The fan speed must be high enough to keep components cooled but low enough to prevent a heat pipe from freezing in cold ambient conditions. The fan speed and in particular a predefined lower speed limit of the fan may be dependent on the characteristics of the cooling system i.e., on the characteristics of the fan, the heat sink, the heat pipe, the cooling channels and/or the loss generating components of the device.

In unfavourable conditions, the forced cooling may speed up the heat pipe freezing and counteract the unfreezing effect of the heat source. Once the fluid inside the heat pipe is frozen, the cooling efficiency of the heatsink is considerably reduced and components cooled by the heatsink may overheat and/or cause overtemperature trips. Accordingly, the performance of the electric motor drive may deteriorate or the drive may be damaged.

SUMMARY

The aim of the present invention is to provide an improved method and an improved device such as an electric motor drive or general power converter, which overcome the above outlined problems. This aim is obtained by a method according to claim 1 and a device according to claim 12.

The invention provides a method for cooling a device such as an electric motor drive or a general power converter. The device comprises a heatsink, electronic components connected to the heatsink, a heat pipe connected or integrated to the heatsink, an inlet air temperature measuring device and a cooling fan. The electronic components may comprise any hardware required for providing a functioning electric motor drive or general power converter. The connection between the heatsink on the one side and the electronic components and the heat pipe on the other side may be a direct or indirect contact between said components. The fan is provided for blowing ambient air from the outside of the drive, through an inlet opening and towards the heat pipe and an outlet opening. According to the method, the drive establishes whether the inlet air temperature is below a first temperature threshold value. The drive operates the cooling fan at a low inlet air temperature speed regime if the inlet air temperature is below the first temperature threshold value. The drive may comprise some controller and/or software implementation for performing the required method steps.

The invention makes it possible to recognise cold ambient temperature and limit fan speed accordingly, such that the power loss of a cooled component can keep the fluid inside the heat pipe in a liquid form even in sub-zero ambient temperature conditions. As a result, the present invention makes it possible to avoid disadvantageous situations where the drive suffers an overtemperature fault in low ambient temperatures. The invention prevents the heat pipe at the heatsink from freezing when the drive is operating in low ambient temperatures.

In a preferred embodiment of the invention, the first temperature threshold value is close to the freezing temperature of the working fluid of the heat pipe e.g., 0° C.±5° C.

In another preferred embodiment of the invention, the drive establishes whether the inlet air temperature is above a second temperature threshold value and operates the cooling fan at a high inlet air temperature speed regime if the inlet air temperature is above the second temperature threshold value and the drive was previously operating in the low inlet air temperature speed regime. The high inlet air temperature speed regime may be characterized by higher operating speeds of the fan than the low inlet air temperature speed regime. The second temperature threshold value may be a higher temperature than the first temperature threshold value. According to this embodiment, the fan may be operated at the low inlet air temperature speed regime at ambient temperatures between the two temperature threshold values if the drive was previously operated at the low inlet air temperature speed regime. This means, that if the heat pipe was exposed to low temperatures, the fan will be operated at lower speeds even once the ambient temperature has risen above the first temperature threshold value. Thus, only a limited amount of energy is transferred from the heat pipe to the surroundings in the temperature range between the two threshold values and the risk of freezing of the heat pipe can be further reduced. Two threshold temperatures are used as hysteresis to avoid a situation in which the fan modes would change continuously from one to another and thus causing annoying audible noise from the fan.

In another preferred embodiment of the invention, the second temperature threshold value is higher than the first temperature threshold value, in particular by 5° C. Thus, according to this embodiment, in a temperature range between, for example, 0° C. and 5° C., the fan can be operated in a low inlet air temperature speed regime to avoid freezing of the heat pipe. The actual temperature threshold values may deviate from presently mentioned temperature threshold values by ±2° C. This example may apply to a heat pipe filled with water as a working fluid. With another working fluid filled inside the heat pipe, the temperature values may differ significantly from this example. The actual temperature thresholds are depending on the freezing temperature of the used working fluid.

In another preferred embodiment of the invention, the fan is operated at a predefined low speed. The predefined low speed may correspond to a standstill of the fan or to some low rotational speed of the fan.

In another preferred embodiment of the invention, the fan is operated according to a request from at least one of the electronic components in the high inlet air temperature speed regime. The request of the electronic components may be a function of the temperature of said component, which may be measured by a controller of the drive. The request may yield a signal which controls the fan speed such that required cooling of the electronic component is achieved.

In another preferred embodiment of the invention, the working fluid of the heat pipe comprises water, methanol and/or acetone. Water represents a cheap working fluid of the heat pipe, however other suitable fluids may be used as an alternative.

In another preferred embodiment of the invention, the ambient temperature measuring device is an external or internal thermometer.

In another preferred embodiment of the invention, a plurality of cooling fans and a plurality of associated temperature measuring devices are provided, wherein the drive operates all cooling fans at the low inlet air temperature speed regime if the inlet air temperature measured by one of the temperature measuring devices is below the first temperature threshold value and/or the drive operates all cooling fans at the high inlet air temperature speed regime, if the inlet air temperature measured by one of the temperature measuring devices is above the second temperature threshold value and if the drive was previously operating in the low inlet air temperature speed regime and/or fan speeds of the plurality of cooling fans are controlled independently of each other. A controller of the drive may be connected to the cooling fans and the temperature measuring devices such that it may evaluate the measurements of all temperature measuring devices. The controller may control all fans such that the first temperature measuring device to indicate an exceedance of a threshold value will trigger the change of a speed regime of the fans.

In another preferred embodiment of the invention, the heat pipe is partially filled with working fluid and air has been removed from the heat pipe and/or the working fluid in the heat pipe may be at least partially frozen in an area near the fan.

The invention is also directed at a device such as an electric motor drive or a general power converter comprising a heatsink, electronic components connected to the heatsink, a heat pipe connected to the heatsink, an inlet air temperature measuring device and a cooling fan. The device is designed for performing the presently described method.

BRIEF DESCRIPTION OF THE DRAWINGS

Further features, details and advantages of the invention are given in the claims and in the following description of the figures. The figures show:

DETAILED DESCRIPTION

Figure 1:
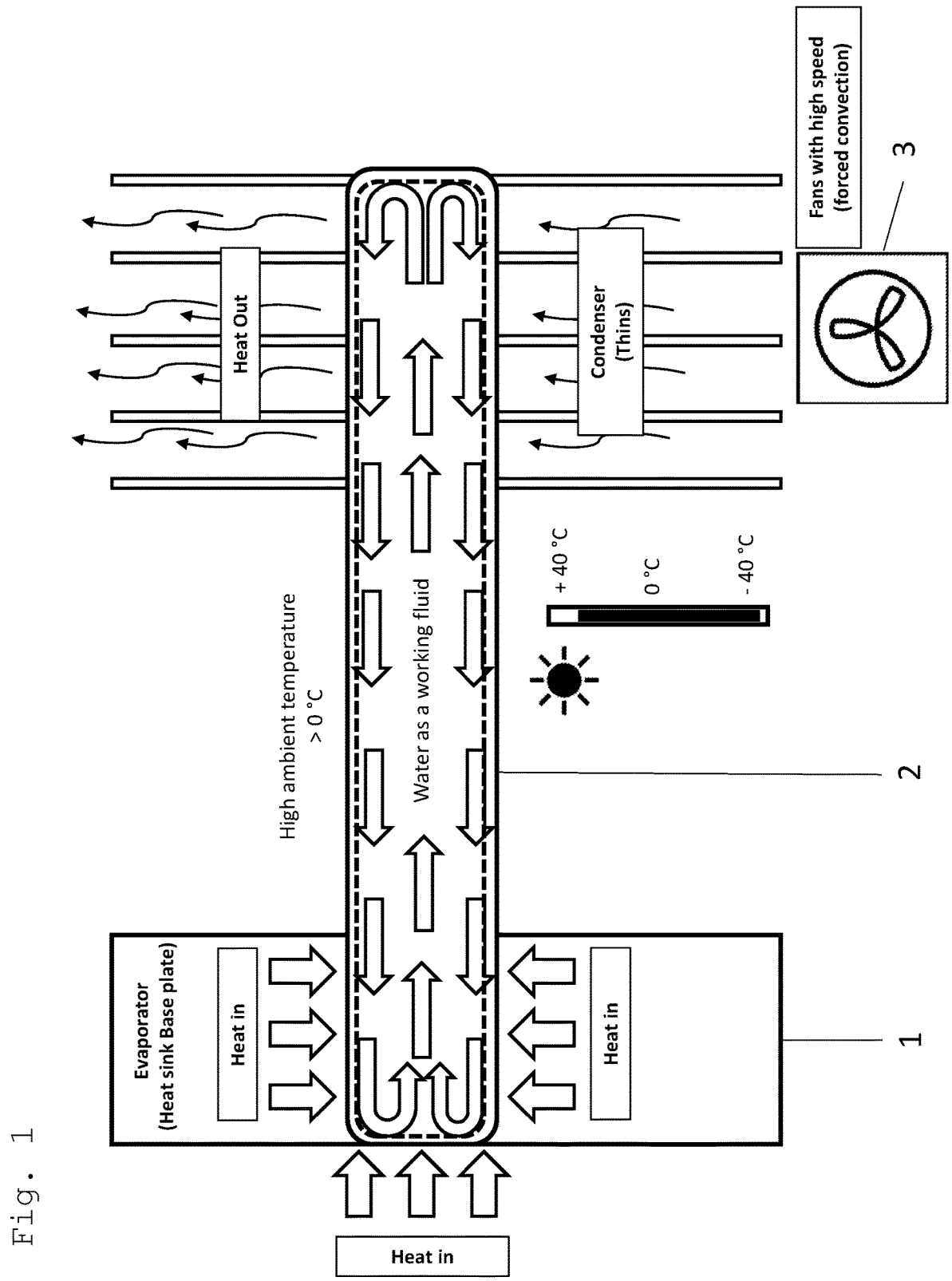
FIG. 1: an operating model of a heat pipe for cooling an electric motor drive, in ambient temperature above 0° C. and according to the state of the art.

FIG. 1 shows an operating model of a heat pipe 2 for cooling an electric motor drive, in ambient temperatures above 0° C. A heat pipe 2 is a sealed container from which air has been removed and in which a vacuum or near vacuum has been created. The heat pipe 2 is partially filled with a working fluid such as water. Water may be used for its low cost and its good heat transfer capacity. However, water may freeze when ambient temperatures drop beneath 0° C. Heat pipe 2 freezing is not a problem as such, since power losses coming from a heat source will usually unfreeze the heat pipe 2 or keep it unfrozen. However, problems arise when forced cooling by e.g., fans 3 is employed in low ambient temperatures. This forced cooling will speed up the heat pipe 2 freezing and work against unfreezing of the heat pipe 2.

The heat pipe 2 may be part of an electrical application such as a motor drive. The evaporator 21 side of the heat pipe 2 may be in thermal contact with a heatsink 1 or some other kind of heat energy receiving base plate. At high ambient temperatures above 0° C., water may circulate freely inside the heat pipe 2 between the evaporator 21 shown on the left side of the figure and the condenser 22 of the heat pipe 2 shown on the right side. The circulation is indicated by arrows inside the heat pipe 2. Arrows outside the heat pipe 2 indicate heat transfers to and from the heat pipe 2. A fan 3 may be provided for creating forced convection at the condenser 22 side of the heat pipe 2, such that the heat transfer out of the heat pipe 2 and into the surrounding ambient air is increased.

Figure 2:
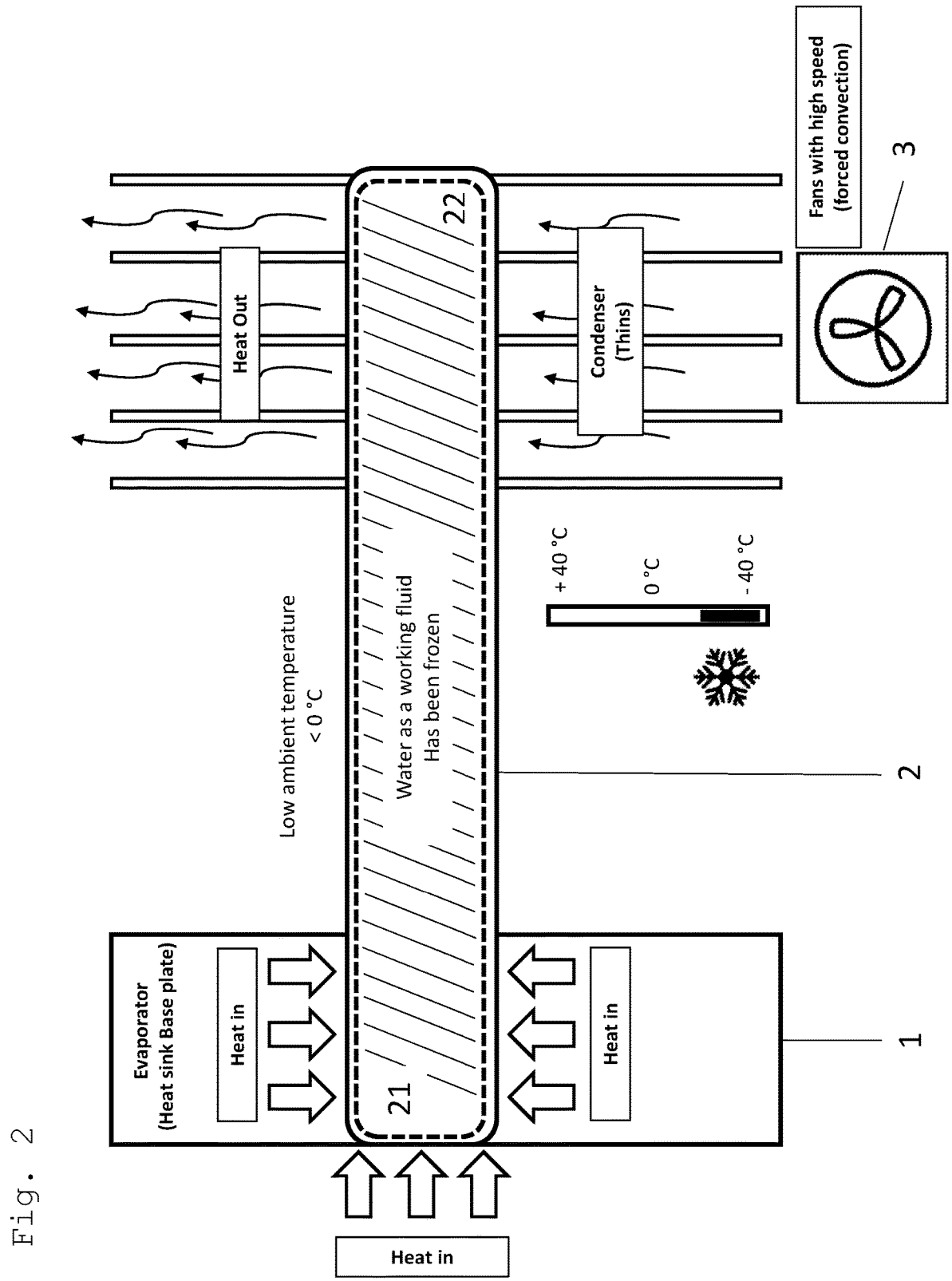
FIG. 2: the heat pipe operating model in ambient temperature below 0° C., the cooling fan operating at full speed and according to the state of the art.

FIG. 2 shows the heat pipe 2 in temperature conditions below 0° C. and the fan 3 operating at full speed. As indicated inside the heat pipe 2, the working fluid of the heat pipe 2 freezes and limits the heat transfer between the evaporator 21 and the condenser 22. The limited heat transfer may result in damage of overheating components, which require cooling. The problem is exacerbated by the high speed fan 3 pushing cold ambient air towards the heat pipe 2 and cooling it further down.

Figure 3:
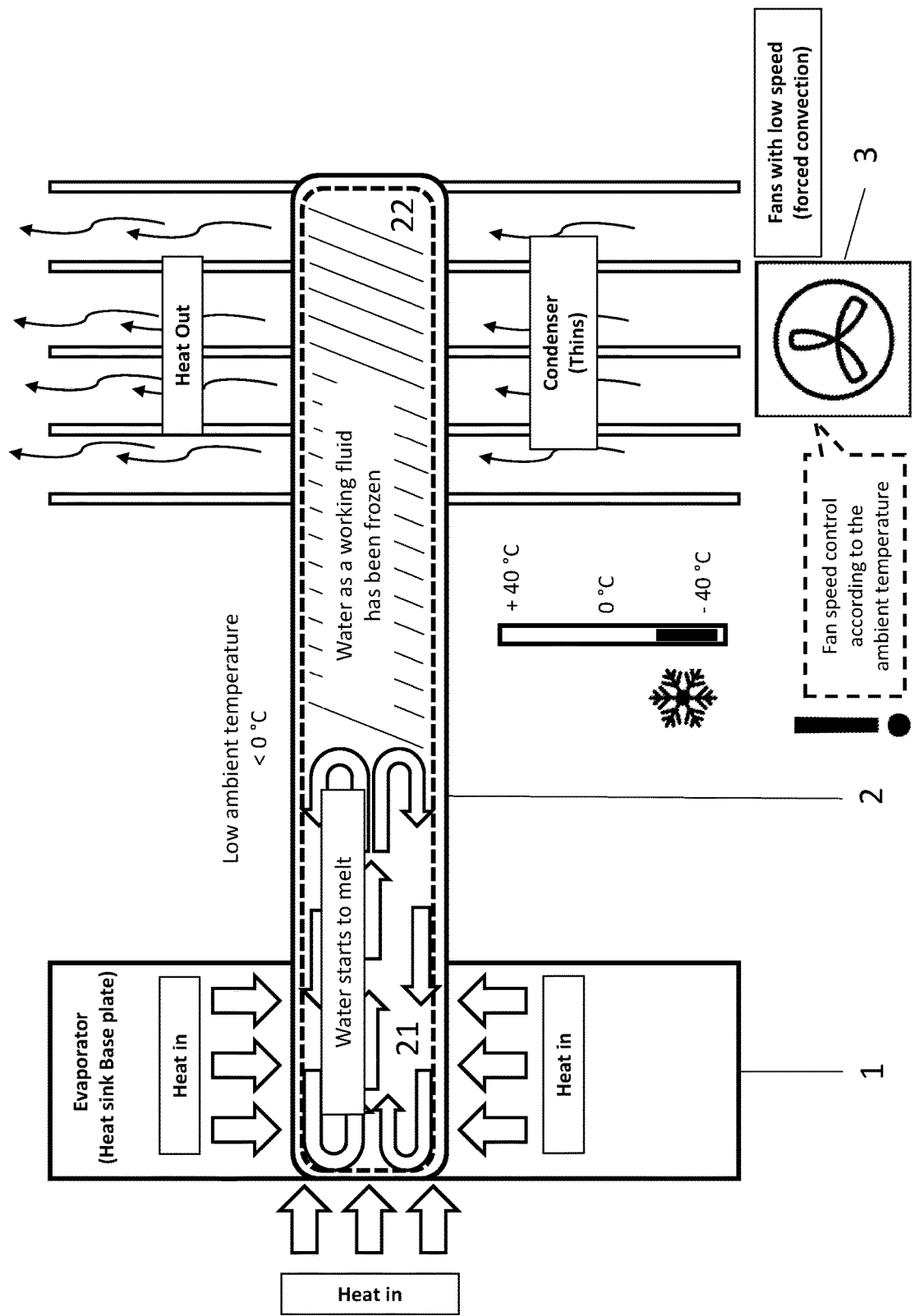
FIG. 3: an operating model of a heat pipe for cooling an electric motor drive, operated according to the present invention.

FIG. 3 shows an operating model of a heat pipe 2 for cooling an electric motor drive, operating in temperature conditions below 0° C. and according to the present invention. The drive comprises the heatsink 1, electronic components connected to the heatsink 1, the heat pipe 2, also connected to the heatsink 1, an inlet air temperature measuring device and the cooling fan 3. The drive may comprise some controller or computer, which is used for establishing whether the inlet air temperature is below a first temperature threshold value $T_{inletAirLow1}$, and for operating the cooling fan 3 at a low inlet air temperature speed regime if the inlet air temperature is below the first temperature threshold value $T_{inletAirLow1}$. The first temperature threshold value $T_{inletAirLow1}$ may be 0° C., in particular when water is used as a working fluid of the heat pipe 2.

As indicated by the reduced number of arrows pointing from the fan 3 to the condenser 22, the fan 3 speed has been reduced by the drive. Accordingly, the effect of forced convection, caused by the fan 3 and additionally cooling the heat pipe 2, is reduced.

The drive may establish whether the inlet air temperature is above a second temperature threshold value $T_{inletAirLow2}$ and operate the cooling fan 3 at a high inlet air temperature speed regime if the inlet air temperature is above said second temperature threshold value $T_{inletAirLow2}$ and the drive was previously operating in the low inlet air temperature speed regime. The second temperature threshold value $T_{inletAirLow2}$ may be 5° C. As a result, in this embodiment, the drive may operate the fan at the low inlet air temperature speed regime at temperatures up to 5° C., if the inlet air temperatures has previously reached sub-zero conditions. This feature may ensure that no freezing of the heat pipe 2 occurs in conditions, in which the drive is operated close to the freezing temperature of the heat pipe's 2 working fluid.

In the low inlet air temperature speed regime, the fan 3 may be operated at a minimum speed, which may correspond to a standstill of the fan 3 or some lowest possible speed at which the fan 3 may be controlled by the drive.

In contrast, in the high inlet air temperature speed regime, the fan 3 may be operated according to a request from at least one of the electronic components of the drive.

The ambient temperature measuring device may be an external or internal thermometer. An internal thermometer may be any temperature measuring device provided at or inside the drive, which is capable of providing readings indicative of the temperature of the drive's surrounding air or inlet air. An external thermometer may refer to any external temperature measuring device which may be connected to the drive and provide corresponding readings.

In an embodiment not shown in the figures, a plurality of cooling fans 3 and a plurality of associated temperature measuring devices may be provided. The drive may operate all cooling fans 3 at the low inlet air temperature speed regime if the inlet air temperature measured by one of the temperature measuring devices is below the first temperature threshold value $T_{inletAirLow1}$. Additionally, or alternatively, the drive may operate all cooling fans 3 at the high inlet air temperature speed regime, if the inlet air temperature measured by one or all of the temperature measuring devices is above the second temperature threshold value $T_{inletAirLow2}$ and if the drive was previously operating in the low inlet air temperature speed regime.

The invention also pertains to an electric motor drive comprising a heatsink 1, electronic components connected to the heatsink 1, a heat pipe 2 connected to the heatsink 1, an inlet air temperature measuring device and a cooling fan 3, wherein the drive is designed for performing the presently described method. In particular, the drive may comprise additional hardware components and/or it may be programmed such that the presently described method steps may be performed by the drive.

Figure 4:
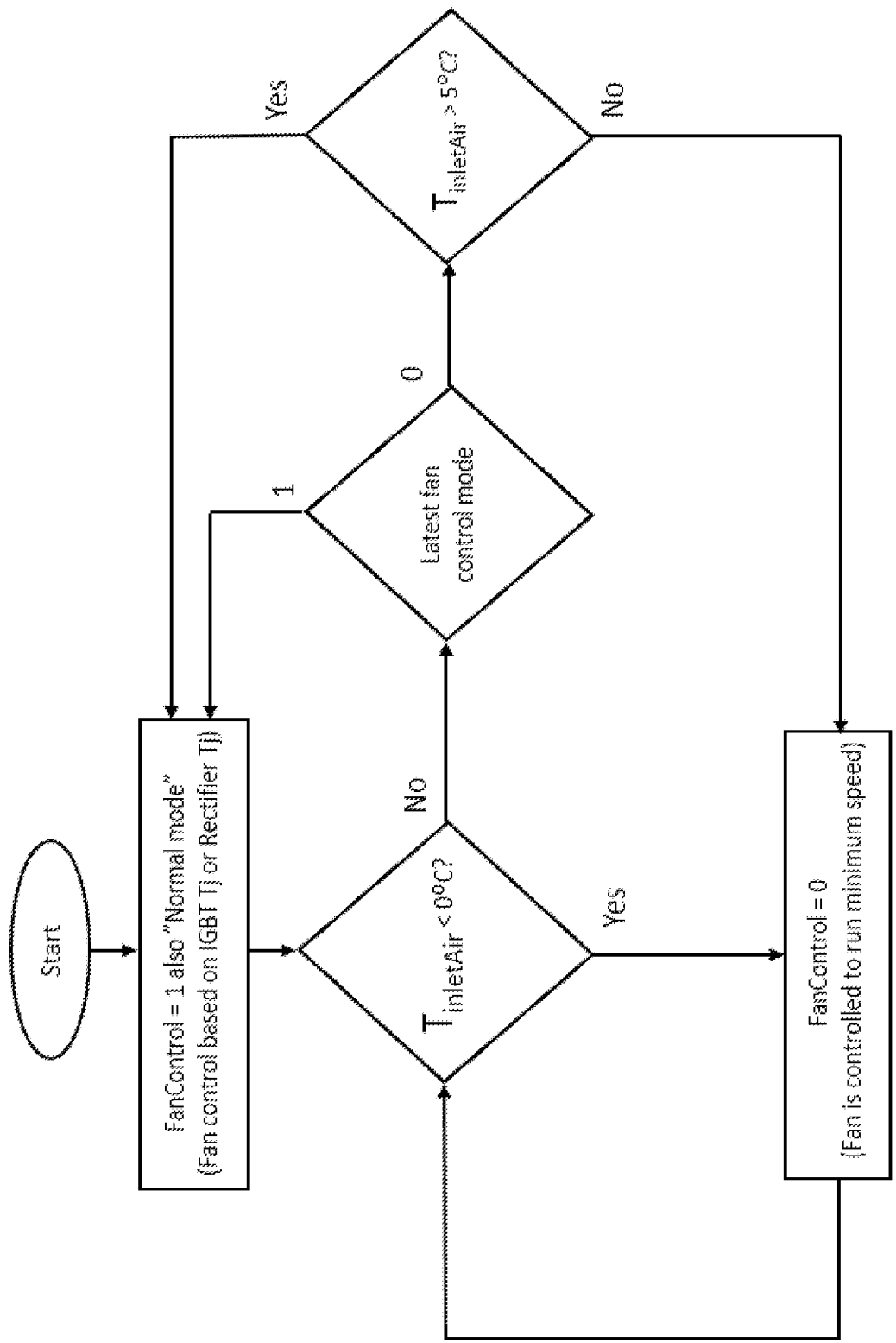
FIG. 4: a basic block diagram of the presently described method.

FIG. 4 shows a basic block diagram of the presently described method. At the start of the execution of the method, the drive may be set to operate the fan 3 in a normal mode as a default setting, i.e., at the high inlet air temperature speed regime. The operating mode of the drive is designated the variable FanControl. In this mode, the fan speed may be controlled based on the temperatures and corresponding cooling requirements of insulated-gate bipolar transistors, rectifiers and/or other components of the drive.

The drive may monitor an inlet air temperature sensor $T_{inletAir}$, which is used as an inlet air temperature measuring device. Its resolution may be chosen to be ≤° C. and it may perform measurements in a range of −40 to 100° C. If the inlet air temperature is found to be lower than the first temperature threshold value $T_{inletAirLow1}$ of, say, 0° C., then the FanControl variable may be set to 0 and the fan will be controlled to run at a predefined low speed by the drive. The method may verify continuously and/or at given instances in time, whether the inlet air temperature remains below zero.

If the inlet air temperature is not found to be lower than 0° C. anymore, then the FanControl variable may remain at 0 until the inlet air temperature is above the second temperature threshold value $T_{inletAirLow2}$, of, say, 5° C.

The present invention changes the topology of main fan 3 speed control of a drive according to the inlet air temperature of the fan 3. In parallel power units, in which multiple inlet air measurements are taken for multiple fan 3 inlets, all power units may measure their own inlet air temperature. The fans 3 may e.g., be controlled according to the first measurements that reach the fan 3 control temperature threshold values.

All features and advantages described in the claims, the description and the drawings, including constructional details, spatial arrangements and process steps, can be useful for the invention both individually and in all possible combinations.

While the present disclosure has been illustrated and described with respect to a particular embodiment thereof, it should be appreciated by those of ordinary skill in the art that various modifications to this disclosure may be made without departing from the spirit and scope of the present disclosure.

The invention claimed is:

1. A method for cooling a device, said device comprising a heatsink, electronic components connected to the heatsink, a heat pipe connected or integrated to the heatsink, an inlet air temperature measuring device and a cooling fan, the method comprising:
  measuring an inlet air temperature with the inlet air temperature measuring device
  comparing, using the electronic components, the inlet air temperature to a first temperature threshold value ($T_{inletAirLow1}$),
  operating the cooling fan at a minimum speed if the inlet air temperature is less than the first temperature threshold value ($T_{inletAirLow1}$) and repeating the comparing the inlet air temperature to the first temperature threshold value ($T_{inletAirLow1}$),
  determining a latest fan control mode if the inlet air temperature is not less than the first temperature threshold value ($T_{inletAirLow1}$) and repeating the comparing the inlet air temperature to the first temperature threshold value ($T_{inletAirLow1}$) if the latest fan control mode includes the cooling fan operating a speed higher than the minimum speed,
  comparing, using the electronic components, the inlet air temperature to a second temperature threshold value ($T_{inletAirLow2}$) if the latest fan control mode includes the cooling fan operating at the minimum speed, operating the cooling fan at the minimum speed and repeating the comparing the inlet air temperature to the first temperature threshold value ($T_{inletAirLow1}$) if the inlet air temperature is not greater than the second temperature threshold value ($T_{inletAirLow2}$), and operating the cooling fan at the speed higher than the minimum speed if the inlet air temperature is greater than the second temperature threshold value ($T_{inletAirLow2}$) and repeating the comparing the inlet air temperature to the first temperature threshold value ($T_{inletAirLow1}$) if the inlet air temperature is greater than the second temperature threshold value ($T_{inletAirLow2}$), wherein the first temperature threshold value ($T_{inletAirLow1}$) is within 5° C. of the freezing temperature of a working fluid partially filling the heat pipe.

2. The method according to claim 1, wherein the second temperature threshold value ($T_{inletAirLow2}$) is 5° C. higher than the first temperature threshold value ($T_{inletAirLow1}$).

3. The method according to claim 1, wherein the minimum speed of the fan is standstill.

4. The method according to claim 1, wherein the fan is operated according to a request from at least one of the electronic components.

5. The method according to claim 1, wherein the heat pipe is at least partially filled with a working fluid comprising water, methanol and acetone.

6. The method according to claim 1, wherein the inlet air temperature measuring device is an external or internal thermometer.

7. The method according to claim 1, wherein a plurality of cooling fans each has an associated temperature measuring device, wherein the measuring, comparing and operating steps are performed independently for each cooling fan and associated temperature measuring device.

8. The method according to claim 1, wherein the heat pipe is partially filled with working fluid and air has been removed from the heat pipe.

9. The method according to claim 1, wherein the heat pipe includes a working fluid that is at least partially frozen in an area near the fan.

10. The method according to claim 1, wherein the device is an electric motor drive.

11. The method according to claim 1, wherein the device is a power converter device.

12. The method according to claim 1, wherein the heat pipe is at least partially filled with a working fluid comprising water.

13. The method according to claim 1, wherein the heat pipe is at least partially filled with a working fluid comprising methanol.

14. The method according to claim 1, wherein the heat pipe is at least partially filled with a working fluid comprising acetone.

15. A device comprising a heatsink, electronic components connected to the heatsink, a heat pipe connected to the heatsink, an inlet air temperature measuring device and a cooling fan, wherein the device is configured to:

measure an inlet air temperature with the inlet air temperature measuring device, compare the inlet air temperature to a first temperature threshold value ($T_{inletAirLow1}$), operate the cooling fan at a minimum speed if the inlet air temperature is less than the first temperature threshold value ($T_{inletAirLow1}$) and repeat comparing the inlet air temperature to the first temperature threshold value ($T_{inletAirLow1}$), determine a latest fan control mode if the inlet air temperature is not less than the first temperature threshold value ($T_{inletAirLow1}$) and repeat comparing the inlet air temperature to the first temperature threshold value ($T_{inletAirLow1}$) if the latest fan control mode includes the cooling fan operating a speed higher than the minimum speed, compare the inlet air temperature to a second temperature threshold value ($T_{inletAirLow2}$) if the cooling fan is operating at the minimum speed, operate the cooling fan at the minimum speed and repeat comparing the inlet air temperature to the first temperature threshold value ($T_{inletAirLow1}$) if the inlet air temperature is not greater than the second temperature threshold value ($T_{inletAirLow2}$), and operate the cooling fan at the speed higher than the minimum speed if the inlet air temperature is greater than the second temperature threshold value ($T_{inletAirLow2}$) and repeat comparing the inlet air temperature to the first temperature threshold value ($T_{inletAirLow1}$) if the inlet air temperature is greater than the second temperature threshold value ($T_{inletAirLow2}$), wherein the first temperature threshold value ($T_{inletAirLow1}$) is within 5° C. of the freezing temperature of a working fluid partially filling the heat pipe.

16. The device according to claim 15, wherein the minimum speed of the fan is standstill.

17. The device according to claim 15, wherein the heat pipe is at least partially filled with a working fluid comprising water, methanol and acetone.

18. The device according to claim 15, wherein the heat pipe is partially filled with working fluid and air has been removed from the heat pipe.

19. The device according to claim 15, wherein the heat pipe includes a working fluid which may be at least partially frozen in an area near the fan.

20. The device according to claim 15, wherein the heat pipe is at least partially filled with a working fluid comprising water.

21. The device according to claim 15, wherein the heat pipe is at least partially filled with a working fluid comprising methanol.

22. The device according to claim 15, wherein the heat pipe is at least partially filled with a working fluid comprising acetone.

* * * * *